(12) United States Patent
Cao et al.

(10) Patent No.: US 11,629,920 B2
(45) Date of Patent: Apr. 18, 2023

(54) STRUCTURAL MOUNT WITH INTEGRATED COOLING FOR AUTONOMOUS VEHICLE SENSORS

(71) Applicant: GM Cruise Holdings LLC, San Francisco, CA (US)

(72) Inventors: Robert Cao, San Francisco, CA (US); Zoran Stefanoski, San Francisco, CA (US)

(73) Assignee: GM Cruise Holdings LLC., San Francisco, CA (US)

( * ) Notice: Subject to any disclaimer, the term of this patent is extended or adjusted under 35 U.S.C. 154(b) by 408 days.

(21) Appl. No.: 16/886,079

(22) Filed: May 28, 2020

(65) Prior Publication Data

US 2021/0372829 A1 Dec. 2, 2021

(51) Int. Cl.
  *F28F 3/12* (2006.01)
  *H05K 7/20* (2006.01)
  *B62D 63/04* (2006.01)
  *G01S 13/931* (2020.01)
  *F28D 21/00* (2006.01)

(52) U.S. Cl.
  CPC ............... *F28F 3/12* (2013.01); *B62D 63/04* (2013.01); *H05K 7/20254* (2013.01); *B60W 2420/52* (2013.01); *B60Y 2400/3017* (2013.01); *F28D 2021/0028* (2013.01); *G01S 13/931* (2013.01); *G01S 2013/9323* (2020.01)

(58) Field of Classification Search
  CPC . F28F 3/12; F28F 7/02; F28F 2255/16; B62D 63/04; H05K 7/20254; H05K 7/20854; H05K 7/20863; H05K 7/20872; B60W 2420/52; B60Y 2400/3017; F28D 2021/0028

USPC ................................................ 165/80.2, 80.4
See application file for complete search history.

(56) References Cited

U.S. PATENT DOCUMENTS

| 7,434,964 B1 * | 10/2008 | Zheng ..................... F21K 9/232 362/240 |
| 7,654,699 B2 * | 2/2010 | Chang ..................... F21V 29/83 362/373 |
| 9,030,822 B2 * | 5/2015 | Sharaf ................... H02M 7/493 174/15.1 |
| 9,795,067 B2 * | 10/2017 | Takezawa ............... H05K 7/209 |
| 9,885,526 B2 * | 2/2018 | Maranville ............... F28F 7/02 |
| 10,013,034 B2 * | 7/2018 | Meng ........................ G06F 1/20 |
| 11,240,932 B1 * | 2/2022 | Andrade ............ H05K 7/20254 |
| 2012/0188717 A1 * | 7/2012 | Albrecht ............ H05K 7/20927 361/699 |
| 2014/0322563 A1 * | 10/2014 | Ketkar .............. H01M 10/6569 429/50 |

(Continued)

FOREIGN PATENT DOCUMENTS

WO WO-2013076853 A1 * 5/2013 ......... H05K 7/20372

*Primary Examiner* — Len Tran
*Assistant Examiner* — Gustavo A Hincapie Serna
(74) *Attorney, Agent, or Firm* — Polsinelli PC (57) ABSTRACT

An example sensor bracket assembly can include one or more cold plates forming a core bracket structure, wherein the core bracket structure and the one or more cold plates provide structural support for the sensor bracket assembly; a housing enclosing the core bracket structure; one or more sensor mounts for mounting one or more sensors on the sensor bracket assembly; and one or more attachment portions for attaching the sensor bracket assembly to a body of a vehicle.

14 Claims, 8 Drawing Sheets

(56) References Cited

U.S. PATENT DOCUMENTS

| | | | |
|---|---|---|---|
| 2015/0043200 A1* | 2/2015 | Wilson | F21S 9/043 362/145 |
| 2015/0216089 A1* | 7/2015 | Tanaka | H05K 7/20927 361/717 |
| 2015/0241144 A1* | 8/2015 | Sarno | F28F 9/007 165/80.4 |
| 2016/0222631 A1* | 8/2016 | Koh | E02F 9/0858 |
| 2016/0227671 A1* | 8/2016 | Meng | G06F 1/20 |
| 2016/0322678 A1* | 11/2016 | Park | H01M 10/6554 |
| 2017/0203377 A1* | 7/2017 | Yokoyama | H01L 21/67103 |
| 2017/0303431 A1* | 10/2017 | Kim | H01L 23/147 |
| 2017/0303445 A1* | 10/2017 | Robert | H05K 7/20872 |
| 2018/0042137 A1* | 2/2018 | Reeves | H05K 7/20254 |
| 2018/0099592 A1* | 4/2018 | Curry, V | B60N 2/28 |

\* cited by examiner

STRUCTURAL MOUNT WITH INTEGRATED COOLING FOR AUTONOMOUS VEHICLE SENSORS

TECHNICAL FIELD

The present disclosure generally relates to sensor brackets for autonomous vehicles and, more particularly, to a sensor bracket having cold plates forming a structural core.

BACKGROUND

An autonomous vehicle is a motorized vehicle that can navigate without a human driver. An exemplary autonomous vehicle includes a plurality of sensor systems, such as, but not limited to, a camera sensor system, a lidar sensor system, a radar sensor system, amongst others, wherein the autonomous vehicle operates based upon sensor signals output by the sensor systems. Specifically, the sensor signals are provided to an internal computing system in communication with the plurality of sensor systems, wherein a processor executes instructions based upon the sensor signals to control a mechanical system of the autonomous vehicle, such as a vehicle propulsion system, a braking system, or a steering system.

As sensors may be mounted on an exterior of the autonomous vehicles, the sensors may be exposed to outdoor environments, which may result in heat through exposure to the sun and other various environmental hazards, such as rocks and water. Such heat can be in addition to heat generated by the autonomous vehicle, the sensors and associated electrical and/or mechanical components. In many cases, the heat from the various sources can damage the sensors and/or degrade their performance and stability.

BRIEF DESCRIPTION OF THE DRAWINGS

The disclosed and other advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

As vehicles begin incorporating additional sensors internally and/or on and around a body of the vehicle, the sensors become more and more susceptible to physical and thermal damage. More specifically, the sensors are susceptible to physical damage, such as rocks that dislodged by a tire of the vehicle or another vehicle near the vehicle Similarly, the sensors are susceptible to thermal damage because the sensors are exposed to solar energy radiated from the Sun as well as heat emitted by components of the vehicle. Moreover, other environmental and operational factors, such as moisture in the area, water from rain, wind, fluids emitted from the vehicle, projectiles emitted by the vehicle or from a nearby object, etc., further compound the potential damages to the sensors environmental hazards and/or operational hazards.

Many of these sensors are important for vehicles to safely navigate streets. Particularly with autonomous vehicles, which do not have human drivers and rely heavily on sensors gathering sensor data, the sensors need to be protected. In particular, the sensors need protection from liquids, such as water, that may cause shorting of circuitry, thermal management to protect increasingly higher heat loads caused by the sensors themselves and/or the operational/environmental environment, and physical protection from potential physical projectiles and/or impacts (e.g., rocks). Additionally, as sensors with higher sensor performances are increasingly used (e.g., higher resolution cameras, longer ranger radars and LiDARs, etc.), thermal management is increasingly important due to the increasing amounts of heat generated by the higher performance sensors. Furthermore, as sensor bracket assemblies are sealed for protection, the result is reduced and/or minimal airflow, which translates to reduced thermal management. To remedy this, the disclosed technology addresses the need in the art for a sensor bracket that is both sealed for protection from outside elements and is capable of managing thermal requirements from various elements in an operational and/or environmental environment, such as solar loading and high ambient temperatures.

Figure 1:
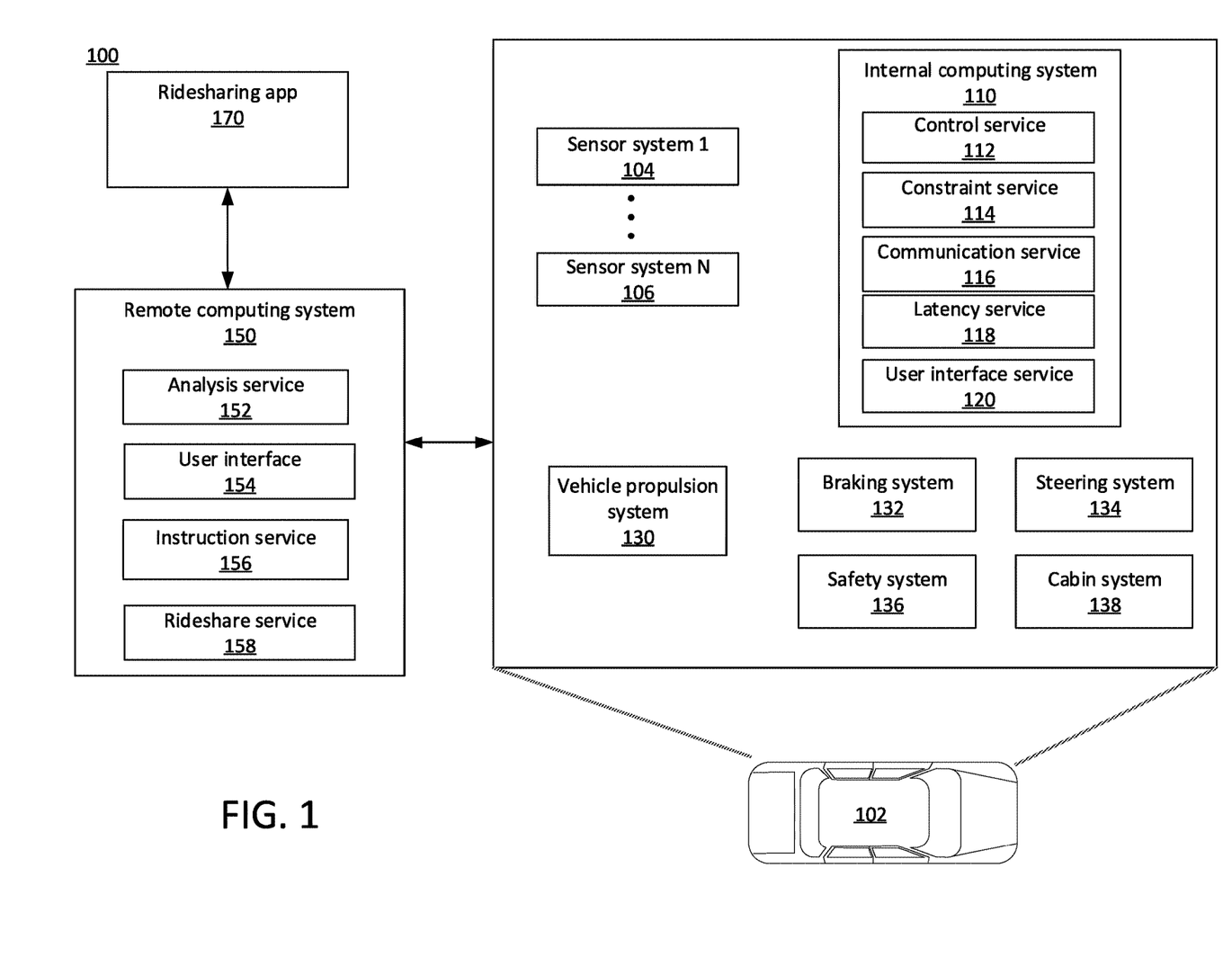
FIG. 1 shows an example system for operating an autonomous vehicle in accordance with some aspects of the present technology.

FIG. 1 illustrates environment 100 that includes an autonomous vehicle 102 in communication with a remote computing system 150.

The autonomous vehicle 102 can navigate about roadways without a human driver based upon sensor signals output by sensor systems 104-106 of the autonomous vehicle 102. The autonomous vehicle 102 includes a plurality of sensor systems 104-106 (a first sensor system 104 through an Nth sensor system 106). The sensor systems 104-106 are of different types and are arranged about the autonomous vehicle 102. For example, the first sensor system 104 may be a camera sensor system, and the Nth sensor system 106 may be a lidar sensor system. Other exemplary sensor systems include radar sensor systems, global positioning system (GPS) sensor systems, inertial measurement units (IMU), infrared sensor systems, laser sensor systems, sonar sensor systems, and the like.

The autonomous vehicle 102 further includes several mechanical systems that are used to effectuate appropriate motion of the autonomous vehicle 102. For instance, the mechanical systems can include but are not limited to, a vehicle propulsion system 130, a braking system 132, and a steering system 134. The vehicle propulsion system 130 may include an electric motor, an internal combustion engine, or both. The braking system 132 can include an engine brake, brake pads, actuators, and/or any other suitable componentry that is configured to assist in decelerating the autonomous vehicle 102. The steering system 134 includes suitable componentry that is configured to control the direction of movement of the autonomous vehicle 102 during navigation.

The autonomous vehicle 102 further includes a safety system 136 that can include various lights and signal indicators, parking brake, airbags, etc. The autonomous vehicle 102 further includes a cabin system 138 that can include cabin temperature control systems, in-cabin entertainment systems, etc.

The autonomous vehicle 102 additionally comprises an internal computing system 110 that is in communication with the sensor systems 104-106 and the systems 130, 132, 134, 136, and 138. The internal computing system includes at least one processor and at least one memory having computer-executable instructions that are executed by the processor. The computer-executable instructions can make up one or more services responsible for controlling the autonomous vehicle 102, communicating with remote computing system 150, receiving inputs from passengers or human co-pilots, logging metrics regarding data collected by sensor systems 104-106 and human co-pilots, etc.

The internal computing system 110 can include a control service 112 that is configured to control the operation of the vehicle propulsion system 130, the braking system 132, the steering system 134, the safety system 136, and the cabin system 138. The control service 112 receives sensor signals from the sensor systems 104-106 as well communicates with other services of the internal computing system 110 to effectuate operation of the autonomous vehicle 102. In some embodiments, control service 112 may carry out operations in concert one or more other systems of autonomous vehicle 102.

The internal computing system 110 can also include a constraint service 114 to facilitate safe propulsion of the autonomous vehicle 102. The constraint service 114 includes instructions for activating a constraint based on a rule-based restriction upon operation of the autonomous vehicle 102. For example, the constraint may be a restriction upon navigation that is activated in accordance with protocols configured to avoid occupying the same space as other objects, abide by traffic laws, circumvent avoidance areas, etc. In some embodiments, the constraint service can be part of the control service 112.

The internal computing system 110 can also include a communication service 116. The communication service can include both software and hardware elements for transmitting and receiving signals from/to the remote computing system 150. The communication service 116 is configured to transmit information wirelessly over a network, for example, through an antenna array that provides personal cellular (long-term evolution (LTE), 3G, 5G, etc.) communication.

In some embodiments, one or more services of the internal computing system 110 are configured to send and receive communications to remote computing system 150 for such reasons as reporting data for training and evaluating machine learning algorithms, requesting assistance from remoting computing system or a human operator via remote computing system 150, software service updates, ridesharing pickup and drop off instructions etc.

The internal computing system 110 can also include a latency service 118. The latency service 118 can utilize timestamps on communications to and from the remote computing system 150 to determine if a communication has been received from the remote computing system 150 in time to be useful. For example, when a service of the internal computing system 110 requests feedback from remote computing system 150 on a time-sensitive process, the latency service 118 can determine if a response was timely received from remote computing system 150 as information can quickly become too stale to be actionable. When the latency service 118 determines that a response has not been received within a threshold, the latency service 118 can enable other systems of autonomous vehicle 102 or a passenger to make necessary decisions or to provide the needed feedback.

The internal computing system 110 can also include a user interface service 120 that can communicate with cabin system 138 in order to provide information or receive information to a human co-pilot or human passenger. In some embodiments, a human co-pilot or human passenger may be required to evaluate and override a constraint from constraint service 114, or the human co-pilot or human passenger may wish to provide an instruction to the autonomous vehicle 102 regarding destinations, requested routes, or other requested operations.

As described above, the remote computing system 150 is configured to send/receive a signal from the autonomous vehicle 102 regarding reporting data for training and evaluating machine learning algorithms, requesting assistance from remote computing system 150 or a human operator via the remote computing system 150, software service updates, rideshare pickup and drop off instructions, etc.

The remote computing system 150 includes an analysis service 152 that is configured to receive data from autonomous vehicle 102 and analyze the data to train or evaluate machine learning algorithms for operating the autonomous vehicle 102. The analysis service 152 can also perform analysis pertaining to data associated with one or more errors or constraints reported by autonomous vehicle 102.

The remote computing system 150 can also include a user interface service 154 configured to present metrics, video, pictures, sounds reported from the autonomous vehicle 102 to an operator of remote computing system 150. User interface service 154 can further receive input instructions from an operator that can be sent to the autonomous vehicle 102.

The remote computing system 150 can also include an instruction service 156 for sending instructions regarding the operation of the autonomous vehicle 102. For example, in response to an output of the analysis service 152 or user interface service 154, instructions service 156 can prepare instructions to one or more services of the autonomous vehicle 102 or a co-pilot or passenger of the autonomous vehicle 102.

The remote computing system 150 can also include a rideshare service 158 configured to interact with ridesharing application 170 operating on (potential) passenger computing devices. The rideshare service 158 can receive requests to be picked up or dropped off from passenger ridesharing app 170 and can dispatch autonomous vehicle 102 for the trip. The rideshare service 158 can also act as an intermediary between the ridesharing app 170 and the autonomous vehicle wherein a passenger might provide instructions to the autonomous vehicle 102 to go around an obstacle, change routes, honk the horn, etc.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Figure 2:
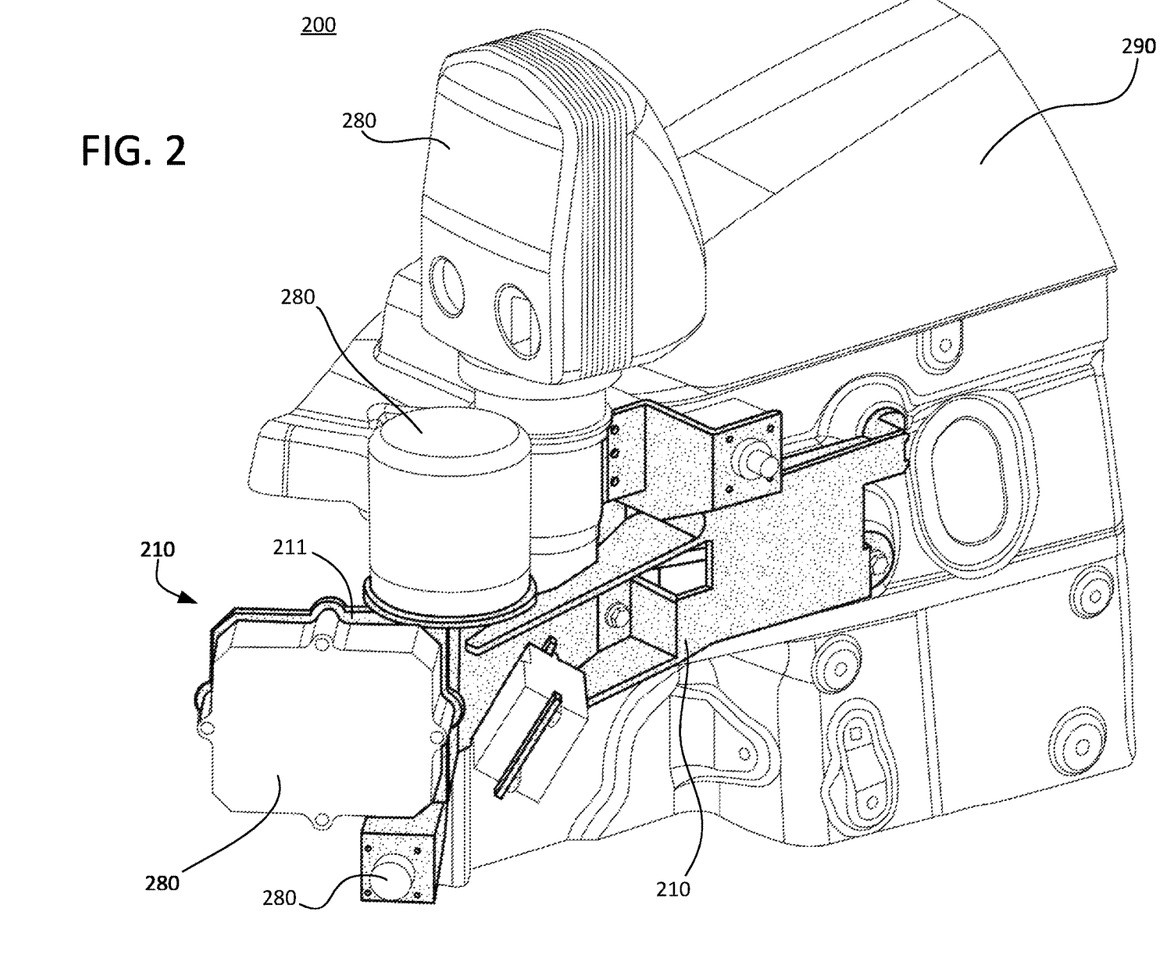
FIG. 2 is an upper perspective view of an example sensor bracket assembly, in accordance with some aspects of the present technology.

FIG. 2 shows an example environment 200 having a bracket assembly 210 or sensor bracket assembly attached to a portion 290 of a vehicle, such as autonomous vehicle 102 shown in FIG. 2. In some implementations, the portion 290 of the vehicle used to attach the bracket assembly 210 to the vehicle can be a fender of the vehicle, but it is to be understood that the bracket assembly 210 may be attached to any portion of the vehicle. The bracket assembly 210 houses and/or provides mounting points for sensors 280, such as the sensor systems 102-104 including, but not limited to, LiDAR sensors, radars, cameras, etc. In some implementations, the bracket assembly 210 may have a generally elongated shape with portions that extend away from the portion 290 of the vehicle. For example, a distal end 211 of the bracket assembly 210 may extend away from the portion 290 of the vehicle so that a sensor 280 disposed on the bracket assembly 210 may have a wider field of view. Similarly, by incorporating multiple sensors 280 and positioning each sensor in a variety of different directions, the field of view is increased.

Figure 3:
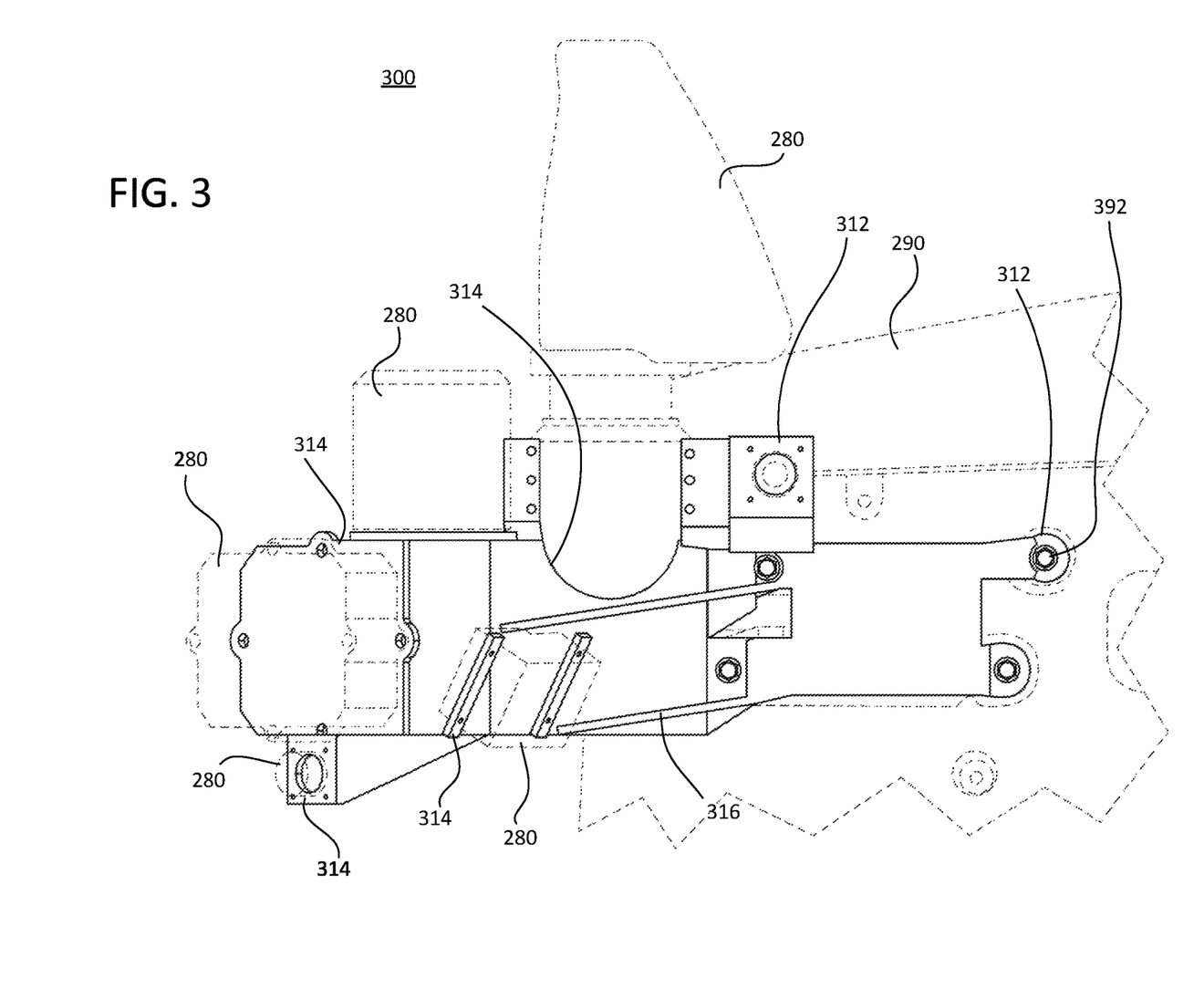
FIG. 3 is a side view of an example sensor bracket assembly, in accordance with some aspects of the present technology.

FIG. 3 shows an example environment 300, which may be a side view of the example environment 200. Bracket assembly 210 may have attachment portions 312 that provide an area to attach the bracket assembly 210 to the portion 290 of the vehicle. In some implementations, bracket assembly 210 is attached to portion 290 of the vehicle via fasteners 392, such as screws, bolts, etc. However, it is to be understood that bracket assembly 210 may be attached to portion 290 of the vehicle via any method and/or combination thereof including, but not limited to, clips, adhesives, retainer clips, etc.

Bracket assembly 210 may further have various mounting portions 314 or sensor mounts for mounting and/or securing sensors 280. In some implementations, the various mounting portions 314 may have various shapes to accommodate various shapes of different sensors 280. For example, one of the mounting portions 314 may have a similar shape to the radar, while one other of the mounting portions may have a semi-spherical cut out and/or a circular surface (as is shown in FIGS. 4A-4B) to accommodate LiDAR sensors.

As discussed briefly above, bracket assembly 210 may have an elongated shape. The elongated shape may allow the bracket assembly 210 and the mounting portions 314 to position sensors 280 beyond the portion 290 of the vehicle and/or the body of the vehicle. Similarly, some portions of the bracket assembly 210 may be angled to position sensors 280 at various angles in relation to the portion 290 of the vehicle. For example, the bracket assembly may be angled to position sensors 280 at various angles in relation to the body of the vehicle, which may result in different and/or wider fields of view for sensors 280 to gather sensor data.

Bracket assembly 210 may also have support ribs or fins 316. The support ribs or fins 316 provide additional support across the bracket assembly 210, so that the bracket assembly 210 can support the weight of the sensors 280.

Figure 4A:
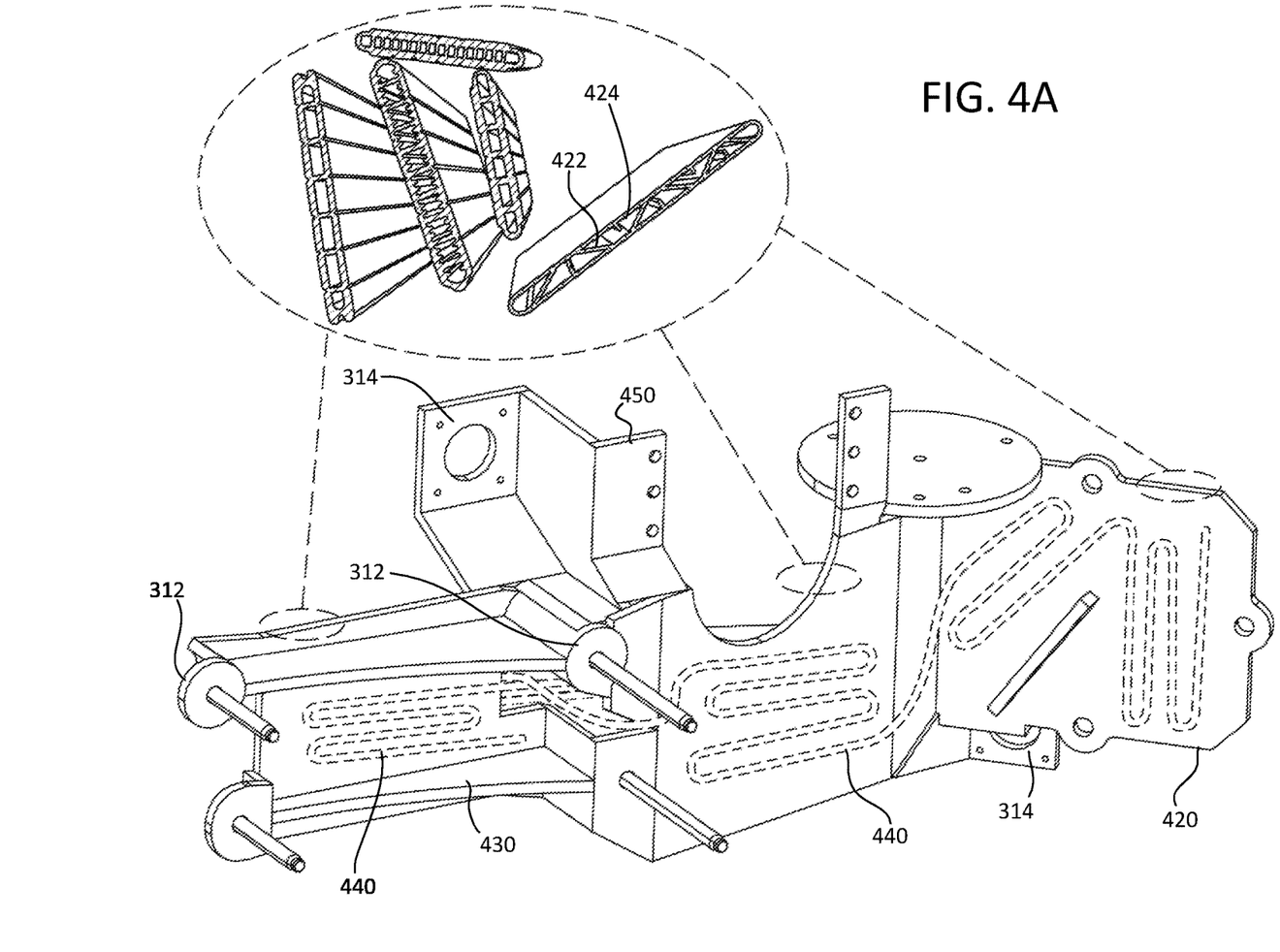
FIGS. 4A-4B are various perspective views of an example sensor bracket assembly, in accordance with some aspects of the present technology.
Figure 4B:
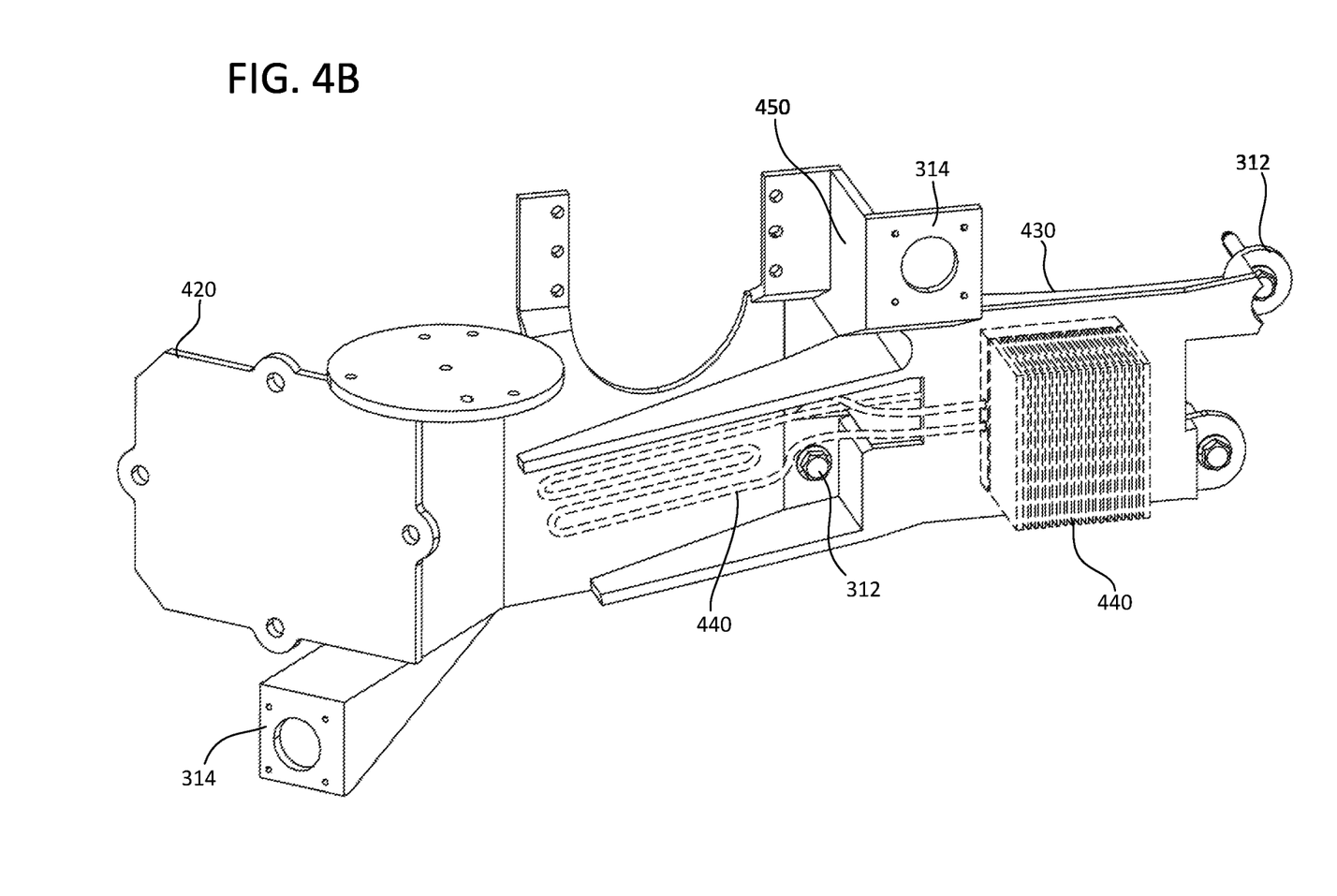

FIGS. 4A-4B show various perspective views of an example bracket assembly 210. Bracket assembly 210 may have attachment portions 312, mounting portions 314, a core bracket structure 420, structural ribs or fins 430, one or more thermal spreaders 440, and a housing 450.

As discussed above, attachment portions 312 may be positioned in various areas along bracket assembly 210 to attach the bracket assembly 210 to the portion 290 of the vehicle. Furthermore, as shown in FIGS. 4A-4B, the attachment portions 312 may have various shapes and surfaces to accommodate different fasteners and different attachment areas on the portion 290 of the vehicle.

As discussed above, mounting portions 314, may have various shapes and sizes to accommodate sensors 280. Similarly, the mounting portions 314 may be positioned in various areas along bracket assembly 210 to position sensors 280. Furthermore, the mounting portions 314 may face different directions to allow each sensor a different field of view.

Core bracket structure 420 can be made with and/or implement one or more cold plates. The cold plate(s) can provide various thermal management features and benefits for sensors 280. Furthermore, the cold plate(s) also provide structural support and/or integrity to the bracket assembly 210. In some cases, the sensors 280 may be mounted on, coupled to, and/or in direct contact with at least a portion of one or more cold plates Similarly, in some cases, the sensors 280 can be indirectly in contact with at least a portion of one or more cold plates (e.g., having a thermal conductive material therebetween).

The size and numbers of cold plates in the core bracket structure 420 can vary based on one or more factors such as, thermal management requirements, number and/or type of sensors 280, type and/or characteristics of the vehicle and/or the portion 290 of the vehicle to which the sensors 280 are attached to via the bracket assembly 210, performance requirements of sensors 280, space and shape considerations, environmental factors, and/or any other factors that can impact the power, thermal, space, shape, performance, and/or configurations requirements associated with the sensors 280. For example, cold plates may be welded, blazed or otherwise combined together with various angles, such that a portion of the core bracket structure 420 may be disposed under a fender of the body of the vehicle, while another portion of the core bracket structure 420 extends outwards and away from the vehicle.

In some implementations, the cold plates may have an extruded design and/or shape, such that the cold plates have internal walls 422 defining internal flow channels 424. In some cases, the foundation of the extrusion is formed based on a two-dimensional (2D) design, which results in a three-dimensional (3D) extruded design as the material is extruded through the foundation. Thus, in these cases, the resulting design is a cold plate having internal walls 422 and internal flow channels 424 built into the extruded shape. The internal walls 422 provide additional support to the structure of the cold plate. As shown, the internal walls 422 may have a variety of different designs. For example, the internal walls 422 may be generally orthogonal to the cold plate, defining generally parallel, rectangular, internal flow channels 424. As another example, the internal walls 422 may be alternatingly diagonal to the cold plate, such that the internal walls 422 further define triangular internal flow channels 424. Internal walls 422 additionally transfer heat by allowing heat to travel from areas of high heat on the cold plate to areas of low heat on the cold plate.

Internal flow channels 424 provide additional thermal management to the cold plates. In some cases, the internal flow channels 424 may simply provide channels for air to remove, transfer, and/or dissipate heat from areas of high heat to areas of low heat. In other cases, the internal flow channels 424 may be and/or have fluid channels containing a fluid that is able to remove, transfer, and/or dissipate heat from the sensors 280. For example, the liquid in the internal flow channels 424 may evaporate into a gas as it absorbs heat from a heat source, travel along the internal flow channel 424, and condense back into a liquid to release the latent heat. The liquid can then return to the hot area through capillary action, centrifugal force, or gravity, at which point the cycle can repeat.

Furthermore, the type of liquid in the internal flow channels 424 can vary based on one or more factors and/or considerations. In the context of autonomous vehicles, the environmental conditions and the conditions surrounding the sensors 280 and the vehicle can vary and are often harsh or extreme. Thus, the properties of the liquid implemented with the internal flow channels 424 can affect the performance of the liquid. For example, depending on various factors, such as the surrounding environment, the implementation of the liquid, surrounding factors and conditions, certain liquids can lead to poor heat transfer, clogging, corrosion, and even system failure, while other liquids may have better heat transfer performance, may not clog, may limit or avoid corrosion, and may reduce the likelihood of system failure.

Accordingly, the type of liquid used can be selected based on the properties of the liquid and the environment, implementation, and surrounding conditions. For example, the liquid can be selected based on the properties of the liquid and the temperature in which the internal flow channels 424 will operate. Non-limiting examples of factors of a liquid that can be considered when selecting a liquid can include the liquid's compatibility with the system's metals, the liquid's thermal conductivity and specific heat, the liquid's viscosity, the liquid's freezing point, the liquid's flash point, the liquid's corrosivity, the liquid's toxicity, the liquid's thermal stability, etc. In some examples, the type of liquid selected can be a liquid determined to have compatibility with the system's metals, high thermal conductivity and specific heat, low viscosity, a low freezing point, a high flash point, low corrosivity, low toxicity, and/or thermal stability. In some examples, the liquid used in the internal flow channels 424 can be water. In other examples, the liquid used in the internal flow channels 424 can be glycol. Moreover, non-limiting examples of other liquids can include de-ionized water, dielectric fluids, alcohol (e.g., methanol, ethanol, etc.), mercury, ammonia, water/glycol, Freon, alkali metals (e.g., cesium, potassium, sodium), refrigerant R134a, etc. In some cases, the same liquid can used in all of the internal flow channels 424. In other cases, different heat pipes can have different types of liquids, which can vary or can be selected based on the one or more factors previously explained.

Structural ribs or fins 430 may be welded, brazed, and/or otherwise constructed onto at least a portion of one or more cold plates of the core bracket structure 420. These structural ribs or fins 430 provide additional strength and stiffness along at least a portion of a length of the cold plates and the core bracket structure 420. In some cases, the structural ribs or fins 430 may also provide additional thermal management by acting as a thermal bridge from some mounting portions 314 to a portion of at least one cold plate of the core bracket structure 420. In other words, in some cases some mounting portions 314 may be disposed away from the cold plates of the core bracket structure 420 and on and/or adjacent to the structural ribs or fins 430. Thus, in cases where the sensors 280 are mounted away from the core bracket structure 420, heat from the sensors 280 are transferred from the sensors 280 through the structural ribs or fins 430 to one of the cold plates of core bracket structure 420.

Thermal spreader 440 may be disposed adjacent to and/or around at least a portion of one of the cold plates of the core bracket structure 420. The thermal spreader 440 may any thermal spreader and/or any combination thereof including, but not limited to, thermal paste, thermal grease, thermal interface materials, one or more heat pipes, one or more fans, one or more liquid cooling loops and/or channels, etc.

In some cases, a housing 450 may enclose the core bracket structure 420, the structural ribs or fins, and/or the thermal spreader 440. The housing 450 may provide the bracket assembly 210 physical protection, dampen vibrations, and provide additional structural support to the bracket assembly 210. In some cases, the housing 450 may be constructed of a plastic material, but it is to be understood that many other materials may be used to construct the housing 450 including, but not limited to, metal, rubber, plastic, etc.

Figure 5A:
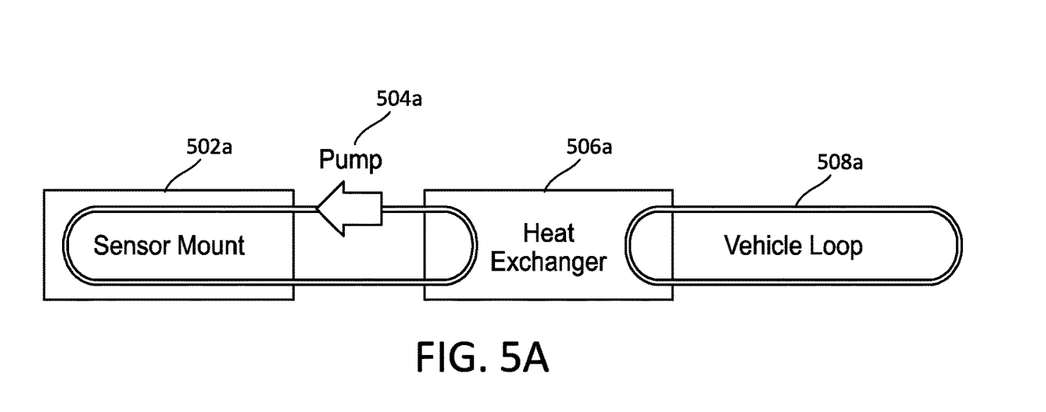
FIGS. 5A-5C are schematic diagrams of various cooling systems that may be used with the sensor bracket assembly, in accordance with some aspects of the present technology.
Figure 5B:
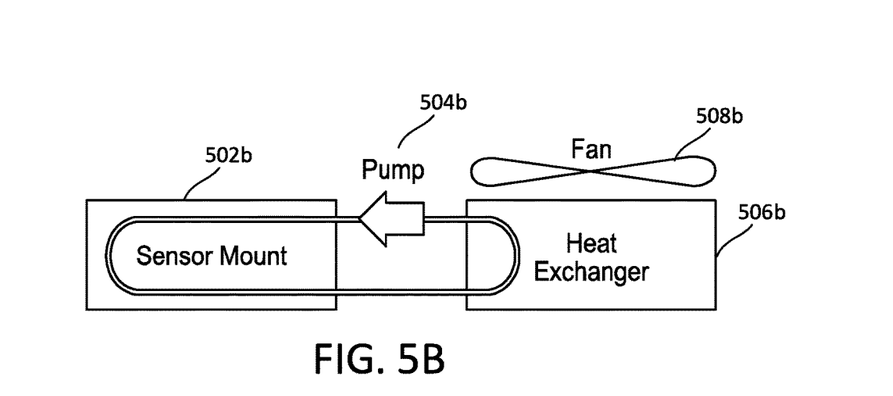
Figure 5C:
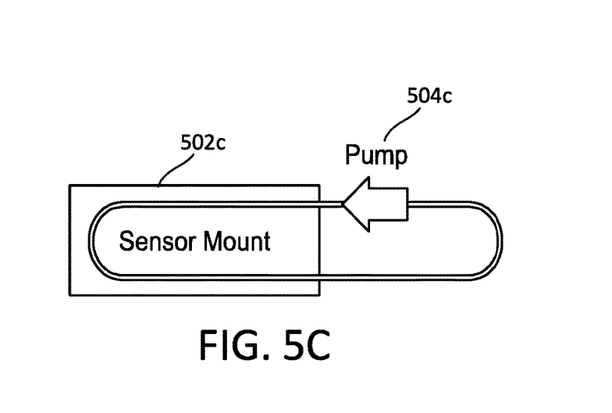

FIGS. 5A-5C show various implementations for transferring heat away from the core bracket structure 420. FIG. 5A shows an implementation in which a bracket liquid cooling loop 502a is in contact with the bracket assembly 210. The bracket liquid cooling loop 502a is further in contact with a heat pump 504a that circulates liquid in the bracket liquid cooling loop 502a. Furthermore, the bracket liquid cooling loop 502a is in contact with heat exchanger 506a. Thus, as the heat pump 504a circulates liquid in the bracket liquid cooling loop 502a, heat in the liquid is removed, transferred, and/or dissipated to the heat exchanger 506a which can also remove, transfer and/or dissipate heat in the liquid. In some examples, the heat exchanger 506a may also be in contact with a vehicle liquid cooling loop 508a, such that the heat in the liquid is removed, transferred, and/or dissipated to the vehicle liquid cooling loop 508a and away from the heat exchanger 506a and/or the sensors 280 on the bracket assembly 210.

FIG. 5B shows another implementation in which a bracket liquid cooling loop 502b is in contact with the bracket assembly 210. The bracket liquid cooling loop 502b is further in contact with a heat pump 504b that circulates liquid in the bracket liquid cooling loop 502b. Furthermore, the bracket liquid cooling loop 502b is in contact with a fin stack 506b. The fin stack 506b is configured to remove, transfer, and/or dissipate heat from the liquid of the liquid cooling loop 502b. In some examples, the fin stack 506b may also be in contact with a fan 508b, such that the heat in the liquid is removed, transferred, and/or dissipated by the fan 508b and away from the fin stack 506b and/or the sensors 280 on the bracket assembly 210.

FIG. 5C shows another implementation, in which a bracket liquid cooling loop 502c is in contact with the bracket assembly 210. The bracket liquid cooling loop 502c is further in contact with a heat pump 504c that circulates liquid in the bracket liquid cooling loop 502c. In some examples, the heat pump 504c circulates the liquid from heat sources and/or areas with higher levels of heat to areas with lower levels of heat, such that the liquid removes heat from the hotter areas to the cooler areas.

Figure 6:
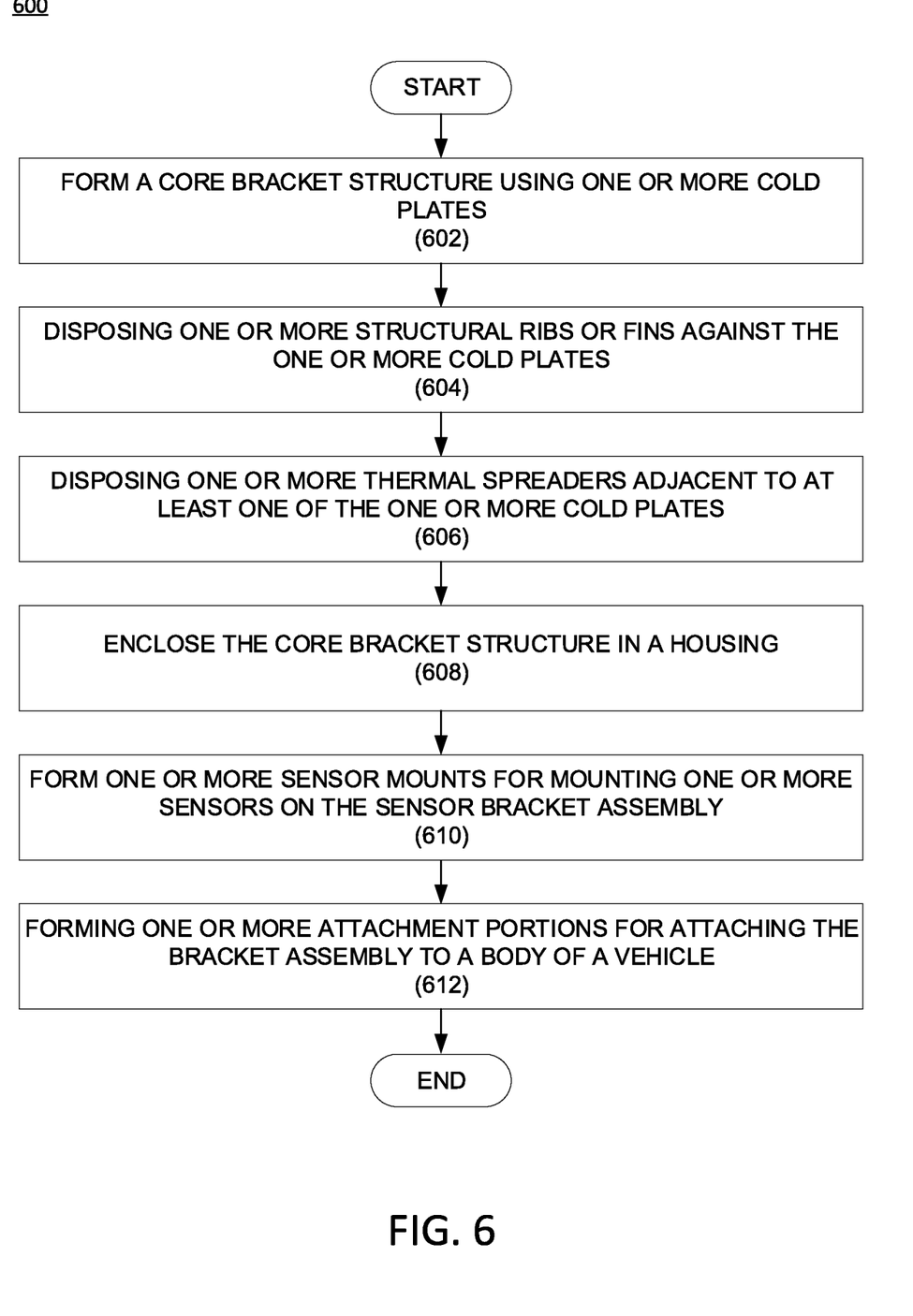
FIG. 6 is an example schematic method diagram for creating or implementing an example sensor bracket assembly, in accordance with some aspects of the present technology.

FIG. 6 shows an example method 600 for making and/or implementing an example bracket assembly 210. The example method 600 begins at step 602, in which a core bracket structure is formed using one or more cold plates, which provides structural support and/or integrity to the bracket assembly. As discussed above, in some examples, the core bracket structure may have a plurality of cold plates. Each of the plurality of cold plates may have an extruded shape. In some cases, at least one cold plate is disposed adjacent to one or more other cold plates to form a bracket portion or structural section, such as a corner. In some cases, the cold plates have internal flow channels for a cooling liquid. In some cases, the internal flow channels may be in contact with a pump configured to circulate the cooling liquid. Moreover, in some cases, the internal flow channels may be in contact with at least one of a heat exchanger, a fin stack in contact with a fan, or a liquid cooling loop. In some of these cases, the heat exchanger, fin stack in contact with a fan, or liquid cooling loop may also be in contact with a vehicle cooling liquid loop associated with the vehicle.

At step 604, one or more structural ribs or fins are disposed against the one or more cold plates. In some cases, two cold plates are disposed adjacent to each other to form a corner. In these cases, at least one of the structural ribs or fins may be disposed in the corner, which provides additional structural support and/or integrity to the cold plates and/or the bracket assembly. As discussed above, the structural ribs or fins may also transfer heat from one or more sensor sensors and/or sensor mounts to a cold plate.

At step 606, one or more thermal spreaders are disposed adjacent to at least one of the one or more cold plates. In some cases, the thermal spreaders are heat pipes disposed along a length of the cold plates to provide additional thermal management by transferring heat along the length of the cold plates. In some cases, the thermal spreaders may be positioned proximate to the cold plates, but are still capable of transferring heat along the length of and/or away from the cold plates.

At step 608, the core bracket structured is enclosed in a housing. The housing may be made of a durable material, which can protect, contain, secure, and/or stabilize the core bracket structured enclosed therein. In some cases, the housing may be constructed to have inlets and/or outlets for tubing, hosing, cooling loops, etc.

At step 610, one or more sensor mounts for mounting one or more sensors are formed or implemented on the sensor bracket assembly. In some cases, the sensor mounts are mounting portions of the housing. In other cases, the sensor mounts are portions of the cold plates.

At step 612, one or more attachment portions for attaching the bracket assembly to a body of a vehicle is formed or implemented on the sensor bracket assembly.

Figure 7:
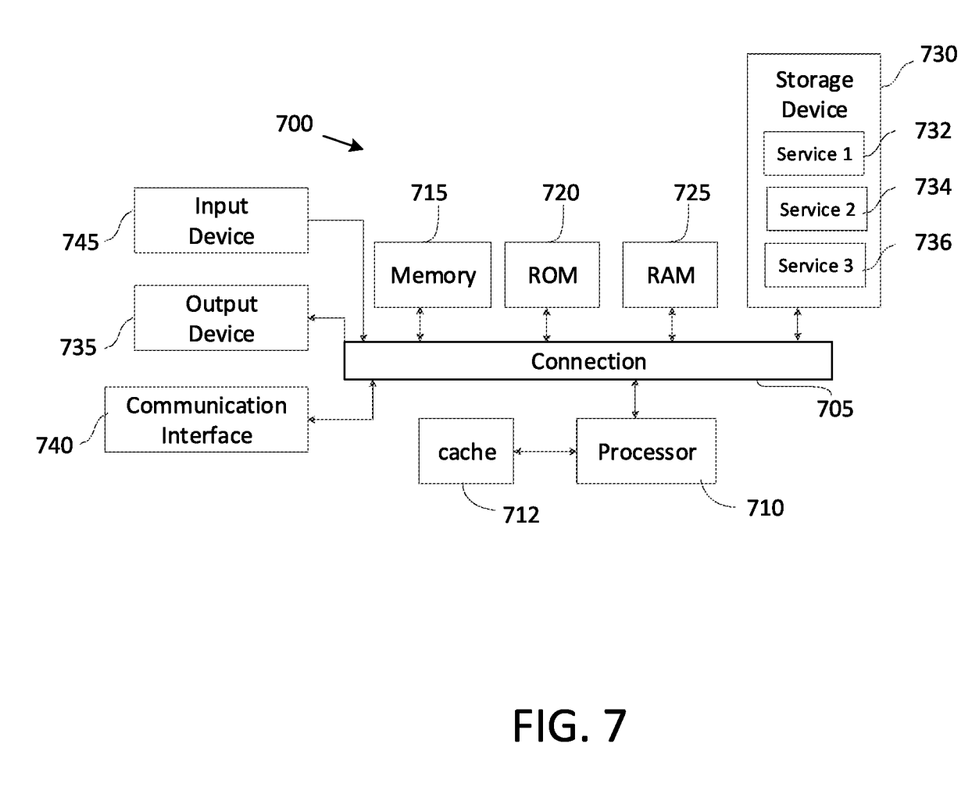
FIG. 7 shows an example of a system for implementing certain aspects of the present technology.

FIG. 7 shows an example of computing system 700, which can be for example any computing device making up internal computing system 110, remote computing system 150, (potential) passenger device executing rideshare app 170, or any component thereof in which the components of the system are in communication with each other using connection 705. Connection 705 can be a physical connection via a bus, or a direct connection into processor 710, such as in a chipset architecture. Connection 705 can also be a virtual connection, networked connection, or logical connection.

In some embodiments, computing system 700 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 700 includes at least one processing unit (CPU or processor) 710 and connection 705 that couples various system components including system memory 715, such as read-only memory (ROM) 720 and random access memory (RAM) 725 to processor 710. Computing system 700 can include a cache of high-speed memory 712 connected directly with, in close proximity to, or integrated as part of processor 710.

Processor 710 can include any general purpose processor and a hardware service or software service, such as services 732, 734, and 736 stored in storage device 730, configured to control processor 710 as well as a special-purpose processor where software instructions are incorporated into the actual processor design. Processor 710 may essentially be a completely self-contained computing system, containing multiple cores or processors, a bus, memory controller, cache, etc. A multi-core processor may be symmetric or asymmetric.

To enable user interaction, computing system 700 includes an input device 745, which can represent any number of input mechanisms, such as a microphone for speech, a touch-sensitive screen for gesture or graphical input, keyboard, mouse, motion input, speech, etc. Computing system 700 can also include output device 735, which can be one or more of a number of output mechanisms known to those of skill in the art. In some instances, multimodal systems can enable a user to provide multiple types of input/output to communicate with computing system 700. Computing system 700 can include communications interface 740, which can generally govern and manage the user input and system output. There is no restriction on operating on any particular hardware arrangement, and therefore the basic features here may easily be substituted for improved hardware or firmware arrangements as they are developed.

Storage device 730 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 730 can include software services, servers, services, etc., that when the code that defines such software is executed by the processor 710, it causes the system to perform a function. In some embodiments, a hardware service that performs a particular function can include the software component stored in a computer-readable medium in connection with the necessary hardware components, such as processor 710, connection 705, output device 735, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed:

1. A sensor bracket assembly comprising:
   one or more cold plates forming a core bracket structure, wherein the core bracket structure and the one or more cold plates provide structural support for the sensor bracket assembly;
   one or more structural ribs or fins disposed against at least a portion of the one or more cold plates;
   one or more sensor mounts for mounting one or more sensors on the sensor bracket assembly; and
   one or more attachment portions for attaching the sensor bracket assembly to a portion of a body of a vehicle,
   wherein the one or more cold plates are a plurality of cold plates, wherein each of the plurality of cold plates have an extruded shape and at least one of the plurality of cold plates is disposed adjacent to at least one other of the plurality of cold plates to form a corner, wherein at least one of the one or more structural ribs or fins are disposed in the corner, and wherein the one or more structural ribs or fins transfer heat from the one or more sensor to the at least one of the plurality of cold plates.

2. The sensor bracket assembly of claim 1, further comprising:
   one or more thermal spreaders disposed adjacent to at least one of the one or more cold plates.

3. The sensor bracket assembly of claim 1, wherein the one or more cold plates have internal flow channels for a cooling liquid, wherein the internal flow channels are in contact with a pump configured to circulate the cooling liquid.

4. The sensor bracket assembly of claim 3, wherein the internal flow channels are in thermal contact with at least one of a heat exchanger, a fin stack in contact with a fan, or a liquid cooling loop.

5. The sensor bracket assembly of claim 4, wherein the at least one of the heat exchanger, the fin stack in contact with the fan, or the liquid cooling loop is in thermal contact with a vehicle cooling liquid loop associated with the vehicle.

6. A vehicle comprising:
   a vehicle body; and
   a sensor bracket assembly attached to the vehicle body, the sensor bracket assembly comprising:
   one or more cold plates forming a core bracket structure, wherein the core bracket structure and the one or more cold plates provide structural support for the sensor bracket assembly;
   one or more structural ribs or fins disposed against at least a portion of the one or more cold plates;
   one or more sensor mounts for mounting one or more sensors on the sensor bracket assembly; and
   one or more attachment portions for attaching the sensor bracket assembly to a portion of the vehicle body,
   wherein the one or more cold plates are a plurality of cold plates, wherein each of the plurality of cold plates have an extruded shape and at least one of the plurality of cold plates is disposed adjacent to at least one other of the plurality of cold plates to form a corner, wherein at least one of the one or more structural ribs or fins are disposed in the corner, and wherein the one or more structural ribs or fins transfer heat from the one or more sensor mounts to the at least one of the plurality of cold plates.

7. The vehicle of claim 6, further comprising:
   one or more thermal spreaders disposed adjacent to at least one of the one or more cold plates.

8. The vehicle of claim 6, wherein the one or more cold plates have internal flow channels for a cooling liquid, wherein the internal flow channels are in contact with a pump configured to circulate the cooling liquid.

9. The vehicle of claim 8, wherein the internal flow channels are in thermal contact with at least one of a heat exchanger, a fin stack in contact with a fan, or a liquid cooling loop.

10. The vehicle of claim 9, wherein the at least one of the heat exchanger, the fin stack in contact with the fan, or the liquid cooling loop is in thermal contact with a vehicle cooling liquid loop associated with the vehicle.

11. A method comprising:
forming a core bracket structure using one or more cold plates, wherein the core bracket structure and the one or more cold plates provide structural support for a sensor bracket assembly;
disposing one or more structural ribs or fins against the one or more cold plates;
forming one or more sensor mounts for mounting one or more sensors on the sensor bracket assembly; and
forming one or more attachment portions for attaching the sensor bracket assembly to a portion of a body of a vehicle,
wherein the one or more cold plates are a plurality of cold plates, wherein each of the plurality of cold plates have an extruded shape and at least one of the plurality of cold plates is disposed adjacent to at least one other of the plurality of cold plates to form a corner, wherein at least one of the one or more structural ribs or fins are disposed in the corner, and wherein the one or more structural ribs or fins transfer heat from the one or more sensor mounts to the at least one of the plurality of cold plates.

12. The method of claim 11, further comprising:
disposing one or more thermal spreaders adjacent to at least one of the one or more cold plates.

13. The method of claim 11, wherein the one or more cold plates have internal flow channels for a cooling liquid, wherein the internal flow channels are in contact with a pump configured to circulate the cooling liquid.

14. The method of claim 13, wherein the internal flow channels are in contact with at least one of a heat exchanger, a fin stack in thermal contact with a fan, or a liquid cooling loop.

* * * * *